United States Patent
Liggett

(10) Patent No.: US 7,875,795 B2
(45) Date of Patent: Jan. 25, 2011

(54) THERMOCOUPLE ARRAY FOR GENERATING ELECTRICAL POWER FOR LIGHTER THAN AIR VEHICLES

(75) Inventor: Paul E. Liggett, Wooster, OH (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/039,959

(22) Filed: Feb. 29, 2008

(65) Prior Publication Data

US 2009/0217962 A1 Sep. 3, 2009

(51) Int. Cl.
*H01L 31/058* (2006.01)
*H01L 35/02* (2006.01)

(52) U.S. Cl. ............... 136/253; 244/29; 244/30; 244/31

(58) Field of Classification Search ......... 244/29–31; 136/227, 253
See application file for complete search history.

(56) References Cited

U.S. PATENT DOCUMENTS

| | | | | |
|---|---|---|---|---|
| 3,775,218 A | * | 11/1973 | Hare et al. | 156/264 |
| 3,956,017 A | * | 5/1976 | Shigemasa | 136/206 |
| 4,106,952 A | * | 8/1978 | Kravitz | 136/206 |
| 5,610,366 A | * | 3/1997 | Fleurial et al. | 136/202 |
| 5,645,248 A | * | 7/1997 | Campbell | 244/30 |
| 6,074,722 A | | 6/2000 | Cuccias | |
| 6,878,871 B2 | * | 4/2005 | Scher et al. | 136/252 |
| 6,979,479 B2 | | 12/2005 | Lavan et al. | |
| 7,150,938 B2 | * | 12/2006 | Munshi et al. | 429/162 |
| 7,261,255 B2 | * | 8/2007 | Li | 244/125 |
| 2004/0245385 A1 | * | 12/2004 | McElroy et al. | 244/58 |
| 2009/0072078 A1 | * | 3/2009 | Choi et al. | 244/30 |

* cited by examiner

*Primary Examiner*—Jennifer K Michener
*Assistant Examiner*—Matthew T Martin
(74) *Attorney, Agent, or Firm*—Daniel J. Schlue; Roetzel & Andress

(57) ABSTRACT

An energy generating device for lighter-than-air vehicles having a gas impervious outer flexible fabric including a flexible photovoltaic array located on the outer layer of the gas impervious fabric; a thermocouple array located between the photovoltaic cells and the gas impervious fabric; a thermally conductive layer or heat spreader between the thermocouple array and the photovoltaic array and between the thermocouple array and the gas impervious flexible fabric; an electrically conductive means connected to said thermocouple array for drawing electrical power away from said thermocouple array; and an electrical load, such as an electrical storage device or a device that consumes electricity, for drawing electricity from the thermocouple array.

1 Claim, 3 Drawing Sheets

THERMOCOUPLE ARRAY FOR GENERATING ELECTRICAL POWER FOR LIGHTER THAN AIR VEHICLES

BACKGROUND OF THE INVENTION

The present invention is directed to a thermoelectric apparatus and method of generating electrical power for Lighter Than Air Vehicles (LTA), such as High Altitude Airships (HAA), during both day and night by using the temperature difference between the LTA's photovoltaic panels and the helium lifting gas employed in the LTA.

LTA vehicles operating at high altitudes for long duration must rely on batteries or fuel cells to store and generate electrical energy for use during the night. Current battery technology is relatively heavy, which limits the payload and altitude of a High Altitude Airship (HAA).

SUMMARY OF THE INVENTION

The present invention is directed to an energy generating device for lighter-than-air vehicles having a gas impervious outer flexible fabric and includes a layer of photovoltaic cells located on the outer layer of the gas impervious fabric; a thermocouple array located between the photovoltaic cells and the gas impervious fabric; an electrically conductive means connected to said thermocouple array for drawing electrical power away from said thermocouple array; and an electrical load for drawing electricity from the thermocouple array, such as an electrical storage device or a device which consumes electricity.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION OF THE INVENTION

The present invention is directed to thermoelectric generation of electrical power for LTA vehicles and relies on the temperature difference between the photovoltaic panels and the helium or hydrogen lifting gas to generate electricity.

Figure 1:
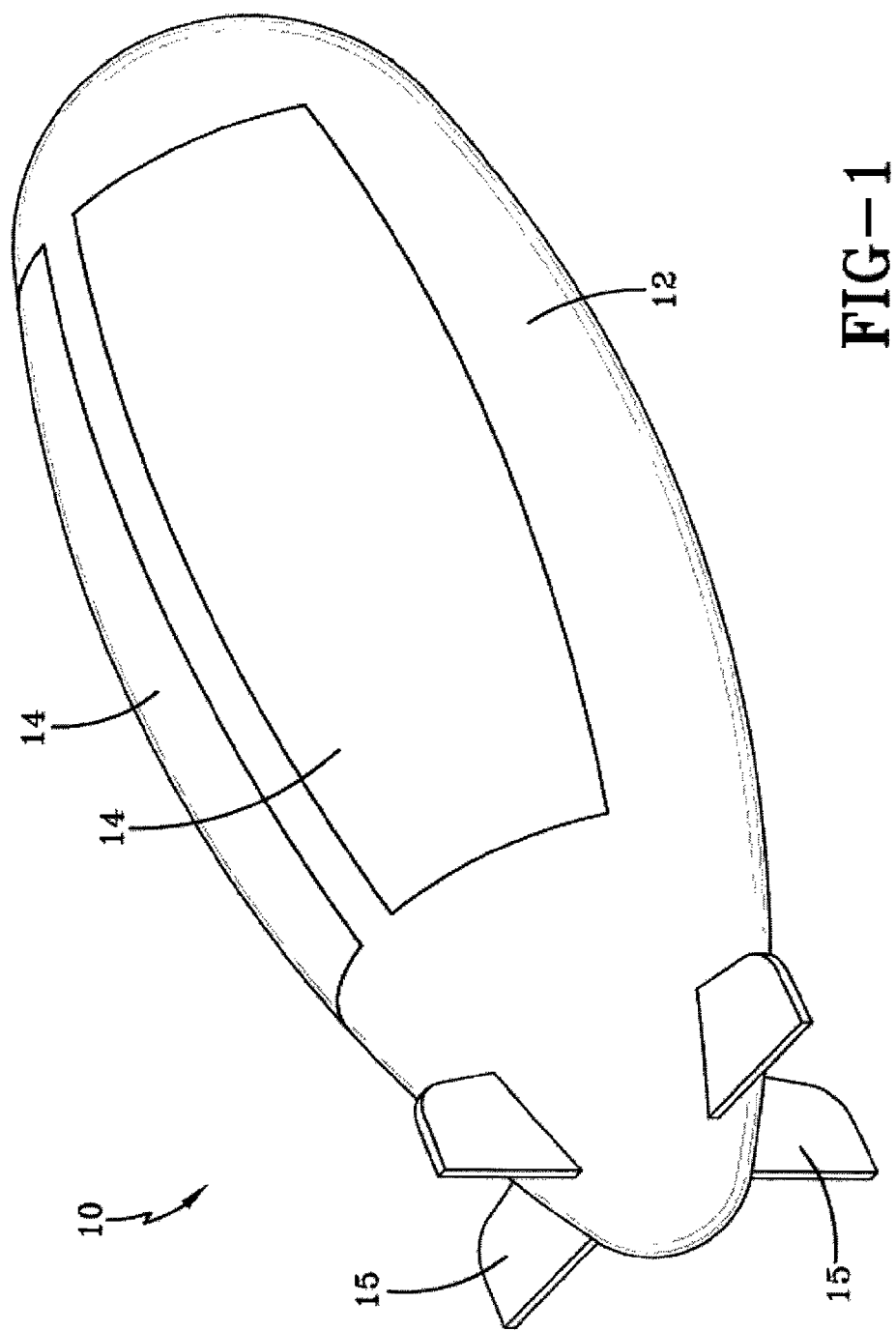
FIG. 1 is a schematic representation of a lighter-than-air vehicle having an array of photovoltaic cells on its surface.

As seen in FIG. 1, a lighter-than-air vehicle 10 has a skin 12 which contains a gas, such as helium or hydrogen, to provide lift for the LTA vehicle. Affixed to the top surface of the LTA vehicle are solar cells or photovoltaic cells 14 which take advantage of the exposure to sunlight and convert the solar energy to electrical energy for use by the LTA vehicle. The photovoltaic cells typically are attached to the outer fabric layer by means of an adhesive backed insulation foam to minimize the conduction of heat from the photovoltaics cells into the LTA vehicle hull and lifting gas.

FIG. 1 illustrates one example of a lighter-than-air vehicle 10. It will be referred to as an LTA or LTA vehicle, but it can be appreciated that the present invention is directed to a flexible laminate construction that is applicable to any lighter-than-air vehicle, platform, or other inflated structure, such as an aerostat, blimp, airship, balloon, or any floating object that is tethered or un-tethered or propelled or unpropelled. Further, the LTA vehicle 10 is shown as including a hull 12 with stabilizing fins 15. The invention could be applied if no fins are provided. It is likely that at least one non-fin stabilizing element (e.g., a vectored fan) is employed. Also hull 12 is shown as having an oblong configuration, it will be appreciated that any shape—sphere, ellipse, parabolic, tear-drop, and the like can be used, and the LTA vehicle 10 can carry a payload (not shown) which may include personnel, surveillance devices, weather monitoring equipment, communications equipment and the like. The size of payload varies in accordance with the size of the vehicle, and can be carried externally, internally, or incorporated into the hull material such as for radar transmit/receive applications. Still further, no means of propulsion, such as engines and/or propellers, is shown in FIG. 1 since the present invention can be employed on propelled, unpropelled, or tethered LTA vehicles.

Typically, these HAA and LTA vehicles are made from laminates of materials that are substantially imperious to helium gas, withstand a wide range of temperature variation, ozone degradation, exposure to ultraviolet light, severe expansion and contraction in view of the wide temperature variations experienced in diurnal cycles, and extreme wind and weather forces. For example, U.S. Pat. No. 6,074,722 to Cuccias teaches a fabric laminate made of a layer of polyurethane resin that is bonded to layers of high strength liquid crystal thermotropic (melt spun) polyester (VECTRAN®), aromatic polyaramide (KEVLAR®), or polyester (DACRON®) fiber woven yarn and polyvinyl fluoride fiber (TEDLAR® or MYLAR®), and having an outer layer of a material that is resistant to degradation by ultra violet radiation. U.S. Pat. No. 6,979,479 teaches a laminate of a liquid crystal polymer fiber yarn layer (VECTRAN®) as an interior surface, an adhesive layer, a polyimide layer, and a polyvinylidene fluoride (PVDF) layer which forms the exterior surface. For fabrics for LTA vehicles operating at high altitudes, it is also advantageous to have a thin aluminum coating as one of the layers to reflect most of the incident solar radiation, reduce helium permeation, minimize the affects of lightening strikes, and provide a means for uniform static electricity distribution over the hull surface.

During the day the surface of the photovoltaic cells becomes hotter than the helium temperature inside the LTA vehicle due to the heating of the sun. The present invention takes advantage of the temperature difference by employing a thermocouple array positioned between the outside or skin of the LTA and the photovoltaic cells to create electrical current.

Figure 2:
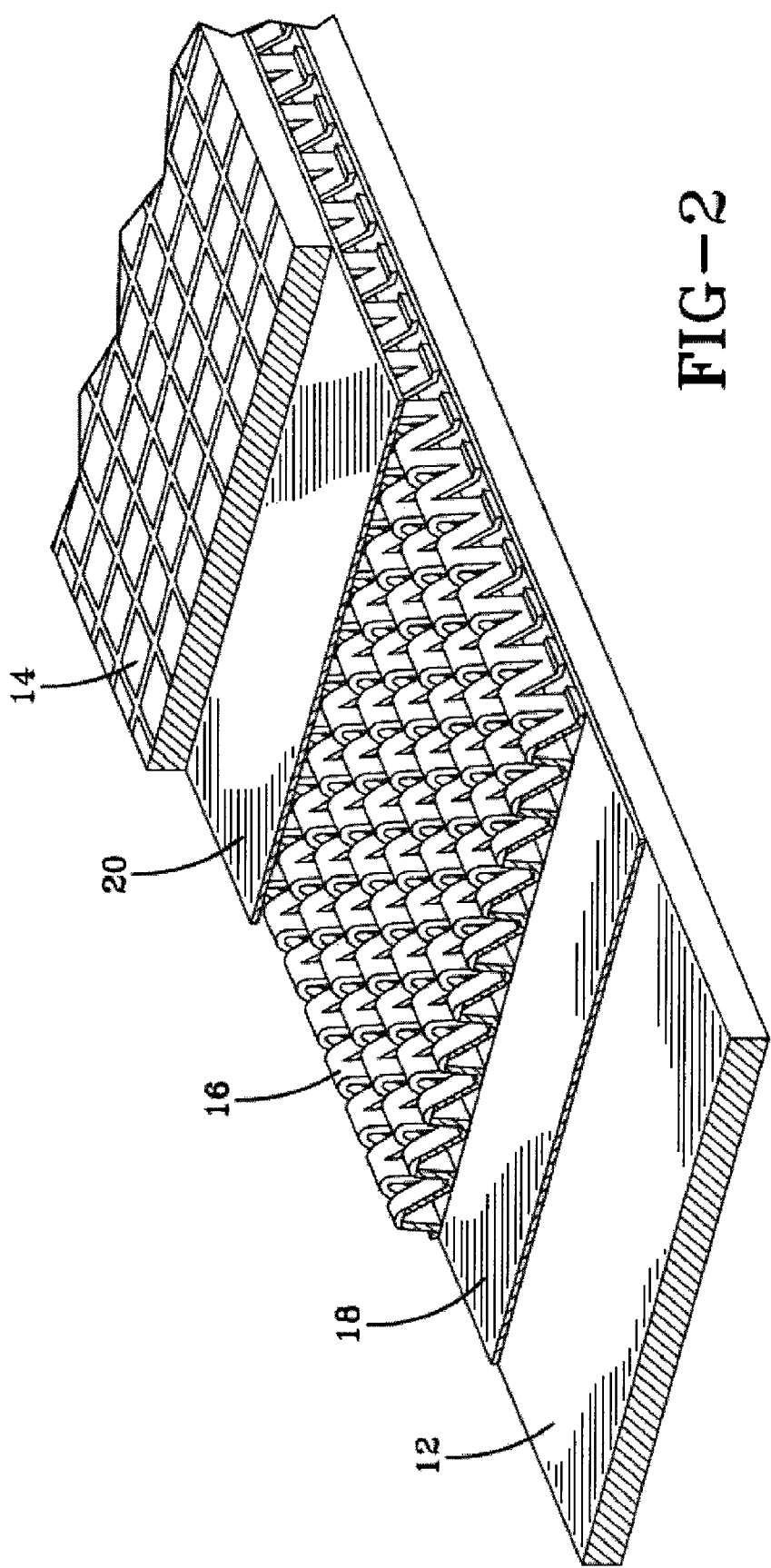
FIG. 2 is a schematic representation of the layered arrangement of the thermocouple array and the photovoltaic cells on the surface of the hull fabric.

As is seen in FIG. 2, a thermocouple array 16 is positioned between the skin 12 of the LTA hull and the photovoltaic cells 14. A thermal conductive layer or heat spreader 20 can be employed positioned between the photovoltaic cells 14 and the thermocouple array 16, and a second thermal conductive layer or heat spreader 18 can be employed between the thermocouple array and the skin 12 of the hull. There is no criticality in the thermal conductive layers other than that they will facilitate the heat transfer between the photovoltaic cells, the thermocouple array and the helium inside the LTA during the day and during the night.

The thermocouple array takes advantage of this heat flow to convert it into electrical energy for use by the LTA or for storage for later use. The thermocouple array is similar to a Peltier thermoelectric device typically used to cool computer components except that the array is used to generate electrical current from a temperature differential while the Peltier device creates a temperature differential from the application of an electrical current. However, both the thermocouple array and the Peltier device can be used to produce electrical current or create a temperature differential.

Figure 3:
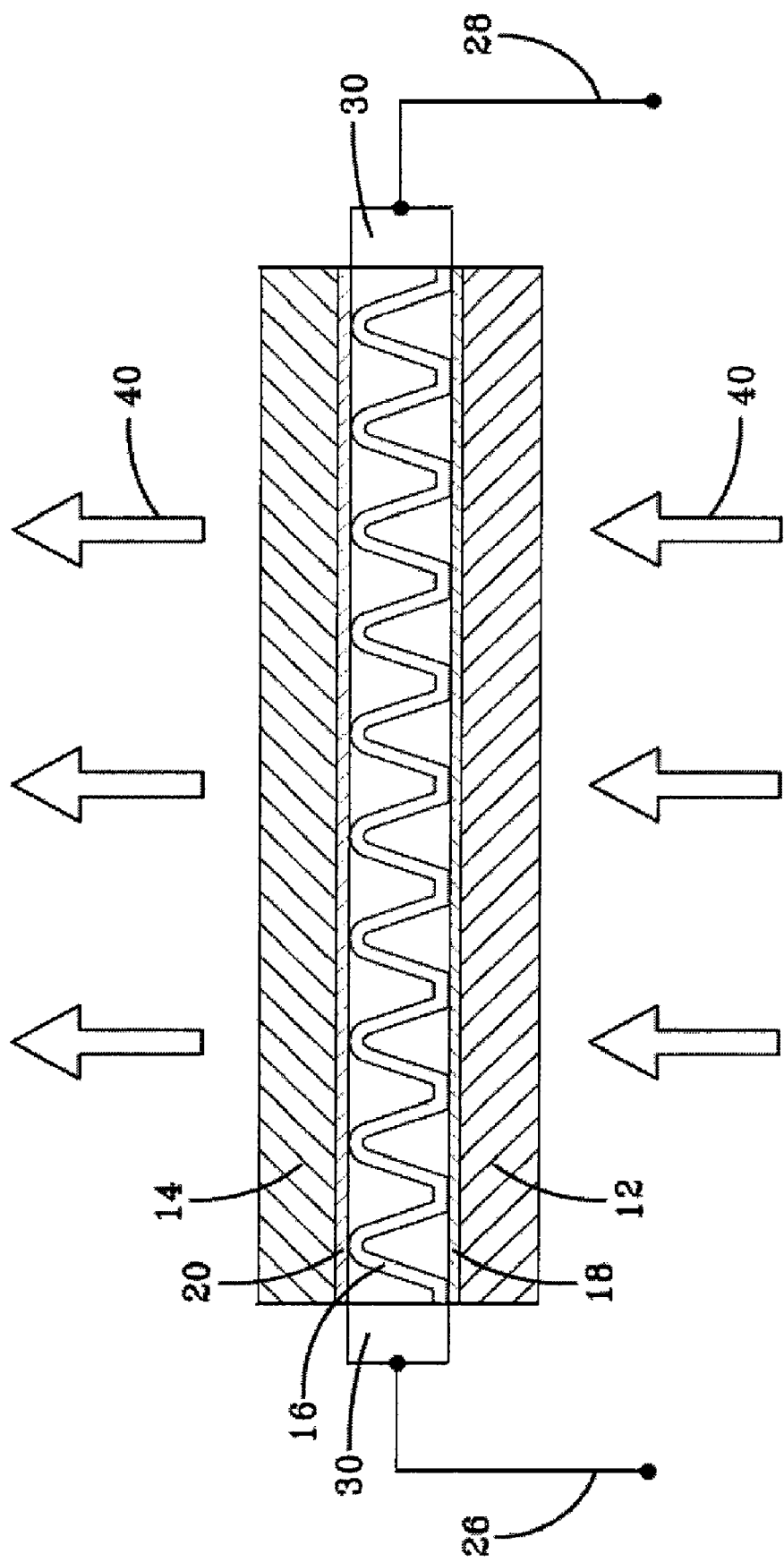
FIG. 3 is representation of the thermocouple arrangement of the present invention.

FIG. 3 shows how the system will operate. Thermal conductive layers 20 and 18 are sandwiched between the thermocouple array 16 and photovoltaic cell 14 on one side and the LTA hull 12 on the other side. Arrows 40 show the thermal flow, for example, at night, when the helium inside the LTA hull 12 is at a higher temperature than the photovoltaic cell 14. The thermocouple array 16 will convert the thermal energy and its differential into electrical energy which is drawn off via electrical busses 30 connected to electrical conductors 26 and 28. The electrical conductors are connected to appropriate electrical storage or electrical consuming devices (not shown) which draw away the electrical energy generated via the thermocouple array.

The thermocouple array can be printed on both sides of an accordion folded thin, flexible, insulating film that is also perforated to allow expansion and contraction in both directions as the LTA hull expands and contracts during day to night pressure changes. This will prevent the hull pressure stresses from being transferred into the fragile photovoltaic cells. The thermocouple metal traces can be printed on the film using the same techniques for the manufacturing of flexible printed circuits on polyimide film such as Kapton® produced by DuPont. The techniques of manufacturing flexible printed circuits may include but are not limited to vacuum metal deposition, photolithography, etching of unwanted metal and electroplating to build metal thickness. The air gaps in the accordion folded thin film will act as an insulator to minimize heat transfer from the photovoltaic cells to the hull fabric and minimize the need for foam insulation. In addition, the thermocouple array will help cool and improve efficiency of photovoltaic cells by removing some of unconverted solar energy and act as an expandable truss structure for mounting the photovoltaic cells on LTA vehicles.

The efficiency of the thermocouple array will be dependent on the thermocouple density and the temperature difference. The thermocouple density can be readily increased by printing thermocouple metal traces on both sides of the polyimide film and by compressing the accordion folds closer together. At night, the photovoltaic cells will be cooler than the helium temperature. Again this temperature difference will create electrical current in the thermocouple array. Thus, the present invention generates electrical power day and night because of the temperature difference which reverses from day to night.

The solar energy collection system or photovoltaic array typically provides electrical energy to energy storage systems, propulsion systems, emergency system, autonomous control systems, communications systems, and mission-specific payloads, none of which are illustrated in the drawings, but which are well known in the art. During the day, the electrical energy generated by the photovoltaic array is used to power the LTA vehicle electrical systems and to recharge the energy storage systems such as fuel cells or batteries. The thermocouple array supplements the photovoltaic array by providing electrical energy during the day and especially during the night to help recharge batteries or in the case of fuel cells to regenerate hydrogen and oxygen by electrolysis of the water by product of the fuel cell reaction.

From the above description of the invention, those skilled in the art will perceive improvements, changes and modifications in the collection and use of electrical energy for LTA vehicles. Such improvements, changes and modifications within the skill of the art are intended to be covered by the appended claims.

I claim:

1. An energy generating device on a lighter-than-air vehicle having a gas impervious outer flexible fabric comprising:
   A. a photovoltaic array located on the outer layer of the gas impervious fabric;
   B. a thermocouple array connected to generate electrical energy located between the photovoltaic array and the gas impervious fabric, wherein the thermocouple array is printed on one or both sides of an accordion folded, thin film;
   C. an electrically conductive means connected to said thermocouple array for drawing electrical power away from said thermocouple array;
   D. an electrical load for drawing electricity from the thermocouple array;
   E. a thermal conductive layer or thermal spreader between the gas impervious flexible fabric and the thermocouple array; and between the photovoltaic array and the thermocouple array; and
   F. wherein the energy-generating device makes up a portion of the exterior of a lighter-than-air vehicle.

* * * * *